United States Patent
Lee et al.

(10) Patent No.: US 12,134,113 B2
(45) Date of Patent: Nov. 5, 2024

(54) SUBSTRATE PROCESSING APPARATUS INCLUDING NOZZLE UNIT AND SUBSTRATE PROCESSING METHOD

(71) Applicant: SEMES CO., LTD., Cheonan-si (KR)

(72) Inventors: Ju Hwan Lee, Hwaseong-si (KR); Hyeon Jun Lee, Cheonan-si (KR); So Young Park, Cheonan-si (KR); Myung A Jeon, Yeosu-si (KR)

(73) Assignee: SEMES CO., LTD., Cheonan-si (KR)

( * ) Notice: Subject to any disclaimer, the term of this patent is extended or adjusted under 35 U.S.C. 154(b) by 3 days.

(21) Appl. No.: 18/117,592

(22) Filed: Mar. 6, 2023

(65) Prior Publication Data

US 2024/0091819 A1    Mar. 21, 2024

(30) Foreign Application Priority Data

Sep. 19, 2022  (KR) ........................ 10-2022-0118145

(51) Int. Cl.
  *B08B 3/02*   (2006.01)
  *B08B 13/00*  (2006.01)
  *H01L 21/67*  (2006.01)

(52) U.S. Cl.
  CPC .............. *B08B 3/022* (2013.01); *B08B 13/00* (2013.01); *H01L 21/67051* (2013.01)

(58) Field of Classification Search
  None
  See application file for complete search history.

(56) References Cited

U.S. PATENT DOCUMENTS

| | | | |
|---|---|---|---|
| 9,786,523 | B2 | 10/2017 | Fonseca et al. |
| 11,139,171 | B2 | 10/2021 | Um |

FOREIGN PATENT DOCUMENTS

| | | |
|---|---|---|
| KR | 10-2015-0137221 | 12/2015 |
| KR | 10-2018-0076082 | 7/2018 |
| KR | 10-2022-0011256 | 1/2022 |

OTHER PUBLICATIONS

Google Patents translation of KR20180076082A (Year: 2024).*
Google Patents translation of KR20180079146A (Year: 2024).*
Office Action from the Korean Intellectual Property Office dated Nov. 9, 2023, not in English.

* cited by examiner

*Primary Examiner* — Eric W Golightly

(57) ABSTRACT

A substrate processing method for processing a substrate, the substrate processing method comprising: a first nozzle moving step of moving a first nozzle to a process position and a standby position in a swing motion manner; a cleaning liquid supplying step of supplying, by the first nozzle, a cleaning liquid onto a rotating substrate at the process position of the first nozzle; a second nozzle moving step of moving a second nozzle to a process position and a standby position in a swing motion manner; a drying gas supplying step of supplying, by the second nozzle, a drying gas onto the rotating substrate at the process position of the second nozzle; and a nozzle distance controlling step of controlling a distance between the first nozzle and the second nozzle on the basis of a horizontal position of at least one of the first nozzle and the second nozzle.

6 Claims, 5 Drawing Sheets

| Selection of optimum conditions | Related art(Ref.) | Present disclosure |
|---|---|---|
| N2 Tip | Ref. (⌀2.5) | ¼ PFA pipe (⌀3.95) |
| ejection height | 15mm | 30mm |
| ejection flow rate | 12LPM | 20LPM |
| Wafer surface maximum pressure | 322.7 Pa | 339.3 Pa |
| N2 Speed distribution |  |  |
| N2 flow rate distribution |  |  |

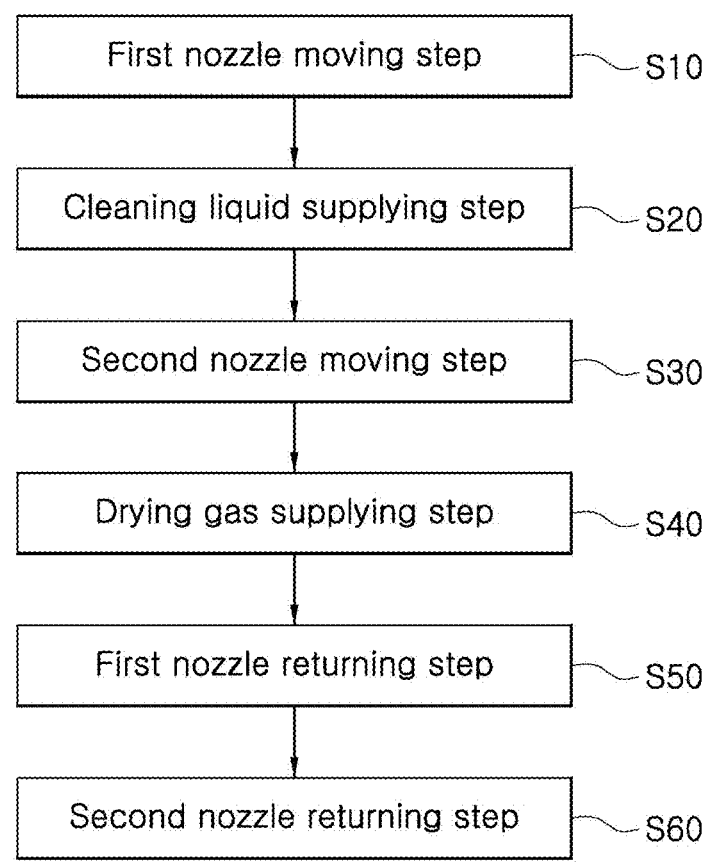

SUBSTRATE PROCESSING APPARATUS INCLUDING NOZZLE UNIT AND SUBSTRATE PROCESSING METHOD

CROSS REFERENCE TO RELATED APPLICATION

The present application claims priority to Korean Patent Application No. 10-2022-0118145, filed Sep. 19, 2022, the entire contents of which is incorporated by reference herein for all purposes.

BACKGROUND OF THE INVENTION

1. Field of the Invention

The present disclosure relates to a substrate processing apparatus including a nozzle unit having two or more individually driven nozzles, and to a substrate processing method using the same substrate processing apparatus.

2. Description of the Related Art

As semiconductor devices have become highly densified, highly integrated, and highly efficient, circuit patterns have been rapidly miniaturized. In general, contaminants such as particles, organic contaminants, and metal contaminants remaining on the surface of a substrate after process tend to greatly affect the characteristics and production yield of a device. For this reason, a cleaning process for removing various contaminants attached to the surface of the substrate has become very important in semiconductor manufacturing. Such a substrate cleaning process is performed before and after each unit process of semiconductor manufacturing.

Conventional cleaning methods used in a semiconductor manufacturing process can be largely classified into dry cleaning and wet cleaning. Of these, the wet cleaning method can be classified into a bath type in which a substrate is immersed in a chemical liquid and contaminants are removed by chemical dissolution or the like; and a spin type in which a substrate is placed on a spin chuck and contaminants are removed by supplying a chemical liquid to the surface of a substrate while rotating the substrate.

In the case of a spin-type apparatus used for conventional spin-type wet cleaning, a nozzle unit is provided on one side of a spin chuck. The nozzle unit includes a chemical liquid supply nozzle for supplying a chemical liquid to a substrate and a gas supply nozzle for supplying an inert gas such as nitrogen to the substrate. When a chemical supply process for supplying the chemical liquid to the substrate is completed, a drying process for drying the substrate is performed. At this time, in order to increase the efficiency of the drying process, a drying gas such as an inert gas is ejected from the gas supply nozzle to the surface of the substrate.

Since the chemical liquid supply nozzle for supplying the chemical liquid onto the substrate and the drying gas nozzle for supplying the inert gas onto the substrate are in general provided as an integrated nozzle on one side of the spin chuck, the chemical liquid supply nozzle inevitably waits above the substrate during the drying process after the chemical liquid supply process. Thus, when a chemical liquid with low surface tension such as isopropyl alcohol (IPA) is used, problems may arise. That is, droplets of IPA are exposed to the outside of a nozzle tip over time. These droplets grow into a larger drop, and finally, during the drying process, the drop falls on the substrate (a so-called "IPA drop phenomenon") and causes static electricity on the substrate. This results in undesired defects on the substrate, such as particles accumulating to one side and particles forming a ring pattern.

In addition, due to its structure, such an integrated nozzle has a limited ejection range of the inert gas, so the inert gas cannot reach an edge area of the substrate on the opposite side of a starting point. That is, when the integrated nozzle is moved to the opposite edge area, the chemical liquid supply nozzle collides with a cup unit. This may cause drying defects and abnormal wafer maps in the edge area of the substrate.

Furthermore, due to a limited chemical liquid supply height, the gas supply nozzle, which is provided integrally with the chemical liquid supply nozzle, is not allowed to be moved beyond the height limit. This limits a usable flow rate in terms of inertia and is disadvantageous in increasing the inert gas atmosphere on an upper surface of the substrate. In addition, there is a risk of chemical liquid scattering from the chemical liquid supply nozzle to the gas supply nozzle. There is also a limitation in that an outlet of the gas supply nozzle needs to be formed smaller than an outlet of the chemical liquid supply nozzle.

The foregoing is intended merely to aid in the understanding of the background of the present disclosure, and is not intended to mean that the present disclosure falls within the purview of the related art that is already known to those skilled in the art.

SUMMARY OF THE INVENTION

Accordingly, the present disclosure has been made keeping in mind the above problems occurring in the related art, and an objective of the present disclosure is to provide a substrate liquid processing technology that eliminates the risk of defects caused by an IPA drop phenomenon and non-uniform drying occurring on a surface of a substrate.

Another objective of the present disclosure is to provide a substrate liquid processing technology that improves drying performance and process utilization by implementing an expanded drying range and prevention of chemical liquid scattering.

The objectives of the present disclosure are not limited to those mentioned above, and other objectives not mentioned will be clearly understood by those skilled in the art from the following description.

In order to achieve the above objectives, according to one aspect of the present disclosure, there is provided a nozzle unit including: a first nozzle configured to eject a liquid onto a substrate; a first actuating module configured to move the first nozzle; a second nozzle configured to eject a gas onto the substrate; and a second actuating module configured to be controlled independently of the first actuating module and configured to be move the second nozzle. The second nozzle may be located closer to a center of the substrate than the first nozzle.

According to another aspect of the present disclosure, there is provided a substrate processing apparatus including: a substrate support unit configured to support a substrate; and a fluid supply unit including a nozzle unit configured to supply a processing fluid onto the substrate supported by the substrate support unit. The nozzle unit may include: a first nozzle configured to eject a cleaning liquid onto the substrate; a first actuating module configured to move the first nozzle; a second nozzle configured to eject an inert gas onto the substrate to dry the substrate; a second actuating module configured to move the second nozzle; and an actuating controller configured to independently control the first actuating module and the second actuating module to determine positions of the first nozzle and the second nozzle. The second nozzle may be located closer to a center of the substrate than the first nozzle.

According to another aspect of the present disclosure, there is provided a substrate processing method for processing a substrate by using a liquid processing apparatus, the substrate processing method including: a first nozzle moving step of moving a first nozzle configured to supply a cleaning liquid onto the substrate to a process position and a standby position in a swing motion manner; a cleaning liquid supplying step of supplying, by the first nozzle, the cleaning liquid onto the rotating substrate at the process position of the first nozzle; a second nozzle moving step of moving a second nozzle configured to supply an inert gas onto the substrate to a process position and a standby position in a swing motion manner; a drying gas supplying step of supplying, by the second nozzle, a drying gas onto the rotating substrate at the process position of the second nozzle; and a nozzle distance controlling step of controlling a distance between the first nozzle and the second nozzle on the basis of a horizontal position of the first nozzle or the second nozzle.

According to the present disclosure, it is possible to enable liquid processing to be efficiently performed on the substrate.

Furthermore, according to the present disclosure, by eliminating a particle source in the substrate processing apparatus, it is possible to prevent contamination of the substrate and the processing space.

Furthermore, according to the present disclosure, by separately providing a chemical liquid supply nozzle for supplying a chemical liquid to the substrate and a gas supply nozzle for supplying an inert gas to the substrate, it is possible to expand the drying range for the substrate and effectively prevent scattering of the chemical liquid, thereby improving drying performance of the substrate and improving quality of the entire liquid processing process.

The effects of the present disclosure are not limited to those mentioned above, and other effects not mentioned will be clearly understood by those skilled in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 6 is a flowchart schematically illustrating a substrate processing method according to an embodiment of the present disclosure.

DETAILED DESCRIPTION OF THE INVENTION

Figure 1:
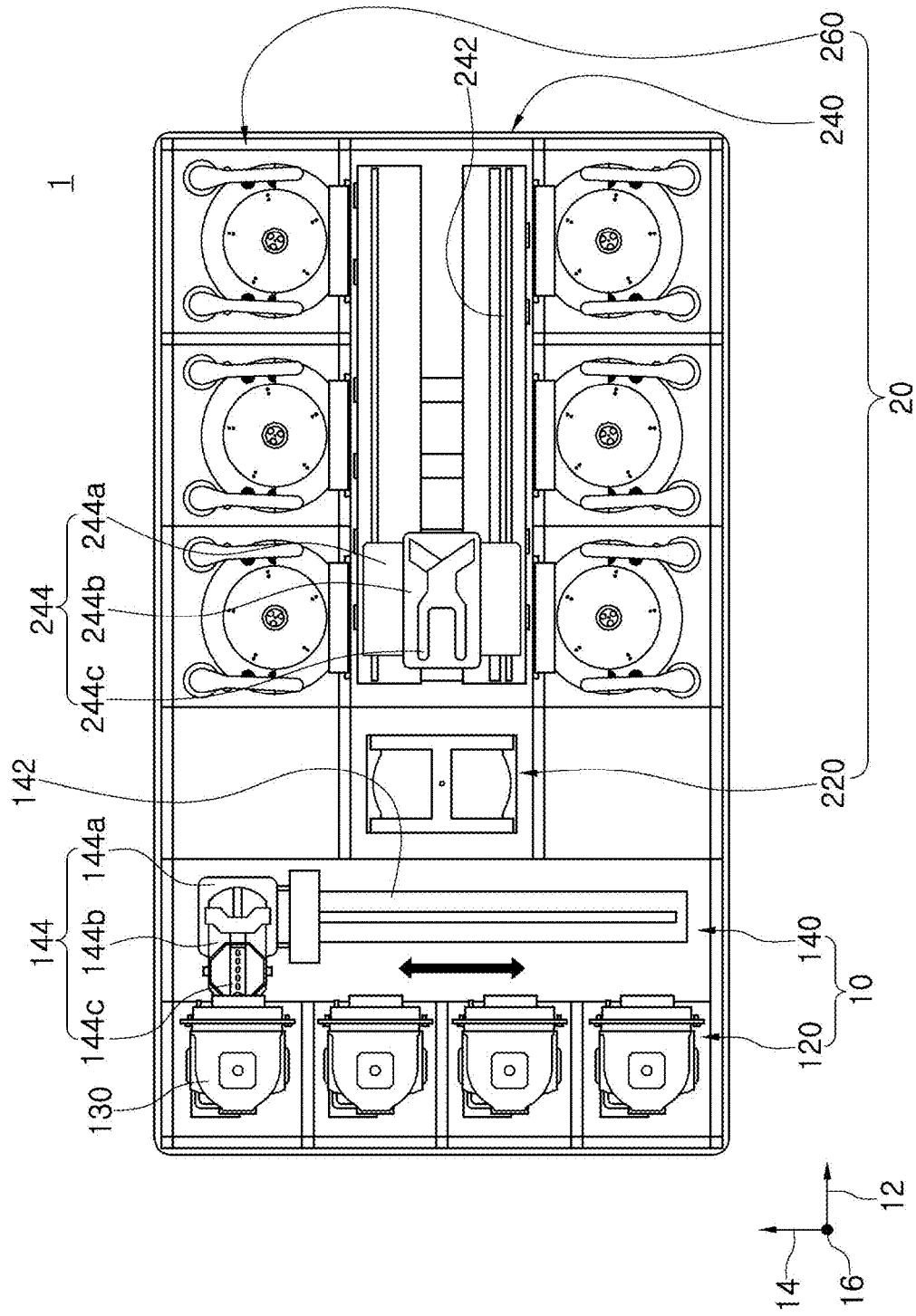
FIG. 1 is a plan view illustrating substrate processing equipment according to an embodiment of the present disclosure.

Hereinafter, exemplary embodiments of the present disclosure will be described in detail with reference to the accompanying drawings such that the present disclosure can be easily embodied by one of ordinary skill in the art to which this disclosure belongs. The present disclosure may, however, be embodied in many different forms and should not be construed as being limited to only the embodiments set forth herein. Variations from the shapes of illustrations, as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. It should be appreciated that the regions illustrated in the figures are schematic in nature and their shapes are not intended to illustrate the actual shape of a region of a device and are not intended to limit the scope of the present disclosure. In the description with reference to the accompanying drawings, identical or similar elements are given the same reference numerals regardless of the reference numerals of the drawings, and repeated description thereof will be omitted.

Further, details of well-known functions and configurations may be omitted to avoid unnecessarily obscuring the presented embodiments. Throughout the drawings, the same reference numerals will refer to the same or like parts.

Technical terms, as will be mentioned hereinafter, are terms defined in consideration of their function in the present disclosure, which may be varied according to the intention of a user, practice, or the like. Thus, the terms should be defined on the basis of the contents of this specification.

As used herein, the singular forms "a", "an", and "the" are intended to include the plural forms as well, unless the context clearly indicates otherwise. It will be further understood that the terms "comprises" and/or "comprising" when used herein, specify the presence of stated features, integers, steps, operations, elements, and/or components, but do not preclude the presence or addition of one or more other features, integers, steps, operations, elements, components, and/or groups thereof. It will be understood that when an element is referred to as being "connected to" (or coupled to) another element, the element can be directly connected to (or coupled to) the other element or be indirectly connected to (or coupled to) the other element having an intervening element therebetween.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the figures, the size of elements or the thickness of lines may be exaggerated for clarity of illustration.

FIG. 1 is a plan view schematically illustrating an example of substrate processing equipment 1 to which the present disclosure is applicable. Referring to FIG. 1, the substrate processing equipment 1 to which the present disclosure is applicable may include an index module 10 and a process processing module 20. The index module 10 may include a load port 120 and an index frame 140. The load port 120, the index frame 140, and the process processing module 20 may be sequentially arranged in a line. Hereinafter, a direction in which the load port 100, the index frame 140, and the process processing module 20 are arranged is referred to as a first direction 12, a direction orthogonal to the first direction 12 when viewed from above is referred to as a second direction 14, and a direction orthogonal to the plane including the first direction 12 and the second direction 14 is referred to as a third direction 16.

A carrier 130 for storing a substrate W may be placed on the load port 120. A plurality of load ports 120 may be provided. The load ports 120 may be arranged in a line along the second direction 14. The number of the load ports 120 may be increased or decreased according to process efficiency and footprint conditions of the process processing module 20. The carrier 130 may have a plurality of slots (not illustrated) therein for storing a plurality of substrates W horizontally to the ground. As the carrier 130, a front opening unified pod (FOUP) may be used.

The process processing module 20 may include a buffer unit 220, a transfer chamber 240, and a process unit 260. The transfer chamber 240 may be disposed such that a longitudinal direction thereof is parallel to the first direction 12. The process unit 260 may be disposed on each side of the transfer chamber 240. As an example, the respective process units 260 may be provided on opposite sides of the transfer chamber 240 symmetrically with respect to the transfer chamber 240. A plurality of process units 260 may be provided on one side of the transfer chamber 240. Parts of the process units 260 may be disposed along the longitudinal direction of the transfer chamber 240. In addition, parts of the process units 260 may be stacked on top of each other. As an example, the process units 260 may be disposed in an A×B arrangement on one side of the transfer chamber 240. Here, A is the number of the process units 260 provided in a line along the first direction 12, and B is the number of the process units 260 provided in a line along the third direction 16. When four or six process units 260 are provided on one side of the transfer chamber 240, the process units 260 may be disposed in a 2×2 or 3×2 arrangement. The number of the process units 260 may be increased or decreased. Unlike the above description, the process units 260 may be provided on only one side of the transfer chamber 240. In addition, the process units 260 may be provided on one side or each side of the transfer chamber 240 in a single layer structure.

The buffer unit 220 may be disposed between the index frame 140 and the transfer chamber 240. The buffer unit 220 may provide a space where the substrate W stays before being transferred between the transfer chamber 240 and the index frame 140. The buffer unit 220 may have a slot (not illustrated) therein for placing the substrate W. A plurality of slots (not illustrated) may be provided to be spaced apart from each other along the third direction 16. The buffer unit 220 may have open opposite surfaces facing the index frame 140 and the transfer chamber 240, respectively.

The index frame 140 may transfer the substrate W between the carrier 130 placed on the load port 120 and the buffer unit 220. The index frame 140 may be provided with an index rail 142 and an index robot 144. The index rail 142 may be disposed such that a longitudinal direction thereof is parallel to the second direction 14. The index robot 144 may be installed on the index rail 142, and may be moved linearly along the second direction 14 on the index rail 142. The index robot 144 may include a base 144a, a body 144b, and an index arm 144c. The base 144a may be moved along the index rail 142. The body 144b may be coupled to the base 144a. The body 144b may be moved along the third direction 16 on the base 144a. In addition, the body 144b may be rotated on the base 144a. The index arm 144c may be coupled to the body 144b, and may be moved forward and backward with respect to the body 144b. A plurality of index arms 144c may be provided to be individually driven. The index arms 144c may be stacked and spaced apart from each other along the third direction 16. Parts of the index arms 144c may be used to transfer the substrate W from the process processing module 20 to the carrier 130, and the remaining parts of the index arms 144c may be used to transfer the substrate W from the carrier 130 to the process processing module 20. This may be to prevent particles generated from the substrate W before a processing process from being attached to the substrate W after the processing process while the index robot 144 loads and unloads the substrate W.

The transfer chamber 240 may transfer the substrate W between the buffer unit 220 and the process units 260 and between the process units 260. The transfer chamber 240 may be provided with a guide rail 242 and a main robot 244. The guide rail 242 may be disposed such that a longitudinal direction thereof is parallel to the first direction 12. The main robot 244 may be installed on the guide rail 242 and may be moved linearly along the first direction 12 on the guide rail 242. The main robot 244 may include a base 244a, a body 244b, and a main arm 244c. The base 244a may be moved along the guide rail 242. The body 244b may be coupled to the base 244a. The body 244b may be moved along the third direction 16 on the base 244a. In addition, the body 244b may be rotated on the base 244a. The main arm 244c may be coupled to the body 244b, and may be moved forward and backward with respect to the body 244b. A plurality of main arms 244c may be provided to be individually driven. The main arms 244c may be stacked and spaced apart from each other along the third direction 16.

The process units 260 may perform a processing process on the substrate W. Each of the process units 260 may include a substrate processing apparatus 300 for liquid processing of the substrate W by supplying a processing liquid to the substrate W. As an embodiment to which the present disclosure is applied, a substrate processing apparatus that performs a cleaning process by supplying a cleaning liquid to the substrate W will be exemplarily described. The respective substrate processing apparatuses 300 included in the process units 260 may have different structures depending on the type of cleaning process to be performed. On the contrary, the respective substrate processing apparatuses 300 included in the process units 260 may have the same structure. Optionally, the process units 260 may be divided into a plurality of groups. Here, the substrate processing apparatuses 300 provided in the process units 260 belonging to the same group may have the same structure, and the substrate processing apparatuses 300 provided in the process units 260 belonging to different groups may have different structures.

Figure 2:
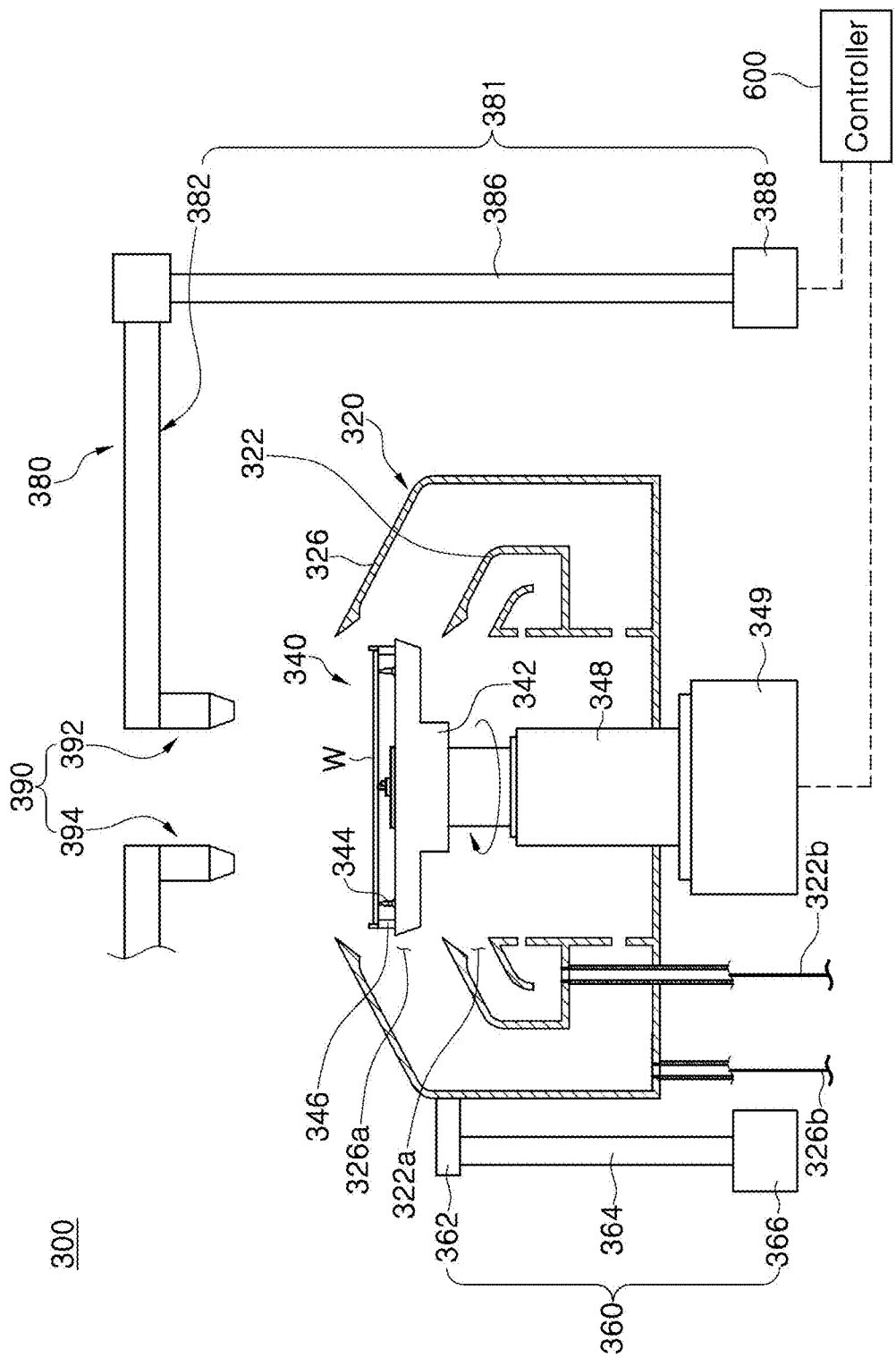
FIGS. 2 and 3 are sectional views illustrating a substrate processing apparatus of the substrate processing equipment illustrated in FIG. 1.
Figure 3:
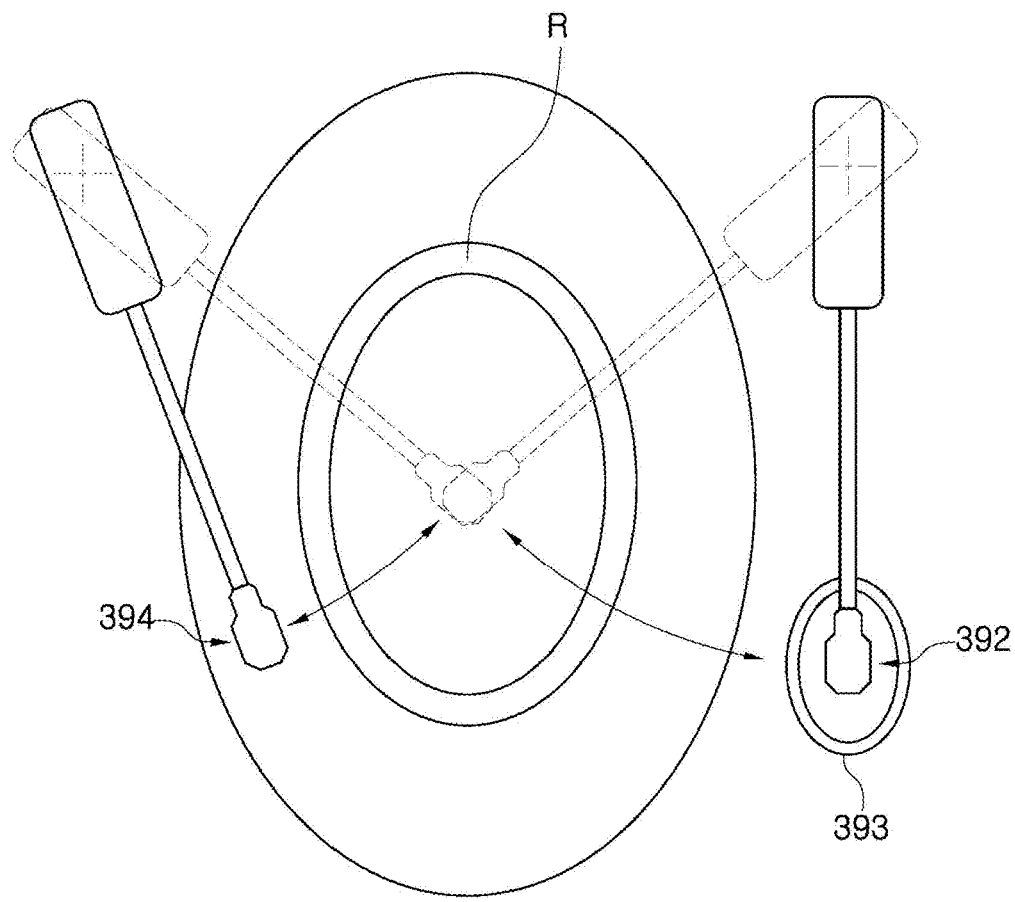

FIGS. 2 and 3 are sectional views schematically illustrating an example of a substrate processing apparatus 300 provided in the process unit 260 illustrated in FIG. 1. FIG. 2 is a schematic sectional view of the substrate processing apparatus 300, and FIG. 3 is a schematic top view of the substrate processing apparatus 300.

The substrate processing apparatus 300 may perform a liquid processing process on a substrate W. In the present embodiment, the liquid processing process for the substrate W is described as a cleaning process. However, the liquid processing process to which the present disclosure is applied is not limited to the cleaning process, and the present disclosure is applicable to various processes in which liquid processing and gas processing of a substrate are performed with a time interval therebetween.

Referring to FIG. 2, the substrate processing apparatus 300 may include a processing container 320, a substrate support unit 340, a lifting unit 360, a fluid supply unit including a nozzle unit 380, and a controller 600.

The processing container 320 may provide a processing space therein where the substrate W is processed. The processing container 320 may have a cylindrical shape with an open top. The processing container 320 may prevent a processing liquid supplied to the substrate W from scattering to the surroundings during the process. As an example, the processing container 320 may have an inner recovery tub 322 and an outer recovery tub 326. The inner and outer recovery tubs 322 and 326 may recover different types of processing liquids used in the process. The inner recovery tub 322 may be provided in an annular ring shape surrounding the substrate support unit 340, and the outer recovery tub 326 may be provided in an annular ring shape surrounding the inner recovery tub 322. An inner space of the inner recovery tub 322 may function as a first inlet 322a through which a processing liquid flows into the inner recovery tub 322. A space between the inner recovery tub 322 and the outer recovery tub 326 may function as a second inlet 326a through which a processing liquid flows into the outer recovery tub 326. As an example, the inlets 322a and 326a may be located at different heights. Recovery lines 322b and 326b may be connected to the bottom of the inner and outer recovery tubs 322 and 326, respectively. The processing liquids introduced into the respective recovery tubs 322 and 326 may be supplied to an external processing liquid regeneration system (not illustrated) through the recovery lines 322b and 326b and reused.

The substrate support unit 340 may support the substrate W in the processing space. The substrate support unit 340 may support and rotate the substrate W during the process. As an example, the substrate support unit 340 may include a spin head. The substrate support unit 340 may include a support member 342, a support pin 344, a chuck pin 346, and a rotation actuating member. The support member 342 may be provided in a substantially circular plate shape with an upper surface and a lower surface. The lower surface may have a smaller diameter than the upper surface. The upper and lower surfaces may be located so that their central axes coincide with each other.

A plurality of support pins 344 may be provided. The support pins 344 may be spaced apart from each other at a predetermined interval on an outer peripheral portion of the upper surface of the support member 342. The support pins 344 may be provided to protrude upward from the support member 342. The support pins 344 may be arranged to form a substantially annular ring shape by combination with each other. The support pins 344 may support an outer peripheral portion of a lower surface of the substrate W so that the substrate W is spaced apart a predetermined distance from the upper surface of the support member 342.

A plurality of chuck pins 346 may be provided. The chuck pins 346 may be arranged farther from the center of the support member 342 than the support pins 344. The chuck pins 346 may be provided to protrude upward from the upper surface of the support member 342. The chuck pins 346 may support lateral side portions of the substrate W so as to prevent the substrate W from being laterally deviated from the original position thereof when the support member 342 is rotated. The chuck pins 346 may be provided to be movable linearly between an outer position and an inner position along a radial direction of the support member 342. Here, the outer position refers to a position farther from the center of the support member 342 than the inner position. When the substrate W is loaded on or unloaded from the substrate support unit 340, the chuck pins 346 may be positioned at the outer position, and when the process is performed on the substrate W, the chuck pins 346 may be positioned at the inner position. In the inner position, the chuck pins 346 and the lateral side portions of the substrate W may be in contact with each other, and in the outer position, the chuck pins 346 and the substrate W may be spaced apart from each other.

The rotation actuating member may rotate the support member 342. The support member 342 may be rotated about its own central axis by the rotation actuating member. The rotation actuating member may include a support shaft 348 and an actuator 349. The support shaft 348 may have a cylindrical shape having a height along the third direction 16. An upper end of the support shaft 348 may be fixedly coupled to the lower surface of the support member 342. As an example, the support shaft 348 may be fixedly coupled to the center of the lower surface of the support member 342. The actuator 349 may provide a driving force for rotating the support shaft 348. The support shaft 348 may be rotated by the actuator 349, and the support member 342 may be rotated in conjunction with the rotation of the support shaft 348.

The lifting unit 360 may linearly move the processing container 320 upward and downward. The upward and downward movement of the processing container 320 may allow the relative height of the processing container 320 with respect to the support member 342 to be changed. The lifting unit 360 may include a bracket 362, a moving shaft 364, and an actuator 366. The bracket 362 may be fixedly installed on an outer wall of the processing container 320. The moving shaft 364 moved upward and downward by the actuator 366 may be fixedly coupled to the bracket 362.

As an example, when the substrate W is loaded on or unloaded from the substrate support unit 340, the processing container 320 may be moved downward so that the substrate support unit 340 protrudes above the processing container 320, and when the process is performed, the height of the processing container 320 may be adjusted so that, according to the type of processing liquid to be supplied to the substrate W, the processing liquid is introduced into a predetermined one of the recovery tubs 322 and 326. Optionally, the lifting unit 360 may move the substrate support unit 340 upward and downward.

The nozzle unit 380 may supply a processing fluid to an upper surface of the substrate W. The upper surface of the substrate W may be a patterned surface having a predetermined pattern formed thereon. The nozzle unit 380 may include an actuating module 381 and a nozzle 390. The nozzle 390 may include a first nozzle 392 for ejecting the processing liquid onto the substrate W and a second nozzle 394 for supplying a drying gas onto the substrate W. The actuating module 381 may include a first actuating module for moving the first nozzle 392 and a second actuating module for moving the second nozzle 394. The first actuating module and the second actuating module may be provided to be connected to the controller 600 and individually controlled by the controller 600. Thus, the first actuating module and the second actuating module may be operated independently of each other. Meanwhile, the first nozzle 392 and the second nozzle 394 may be the same in configuration, and the first actuating module and the second actuating module may be the same in configuration.

For convenience of description below, the first nozzle 392 and the second nozzle 394 will be assumed to have the same configuration and the first actuating module and the second actuating module will be assumed to have the same configuration, and the first nozzle 392 and the second nozzle 394 will be generally described as the nozzle 390 and the first actuating module and the second actuating module will be generally described as the actuating module 381. However, this is only an example for convenience of description, and that it is to be understood that the first nozzle 392 may have different configurations and the second nozzle 394 and the first actuating module and the second actuating module may have different configurations.

The actuating module 381 may move the nozzle 390 to a process position and a standby position. Here, the process position may be defined as a position where the nozzle 390 faces the substrate W placed on the substrate support unit 340, and the standby position may be defined as a position where the nozzle 390 is deviated from the process position. As shown in FIG. 3, a nozzle groove 393 may be further provided at the standby position of the first nozzle 392.

As an example, the process position of the nozzle 390 may include a pre-processing position and a post-processing position. The pre-processing position may be defined as a position where the nozzle 390 supplies the processing liquid to a first supply position, and the post-processing position may be defined as a position where the nozzle 390 supplies the processing liquid to a second supply position. As an example, the first supply position may be a position closer to the center of the substrate W than the second supply position, and the second supply position may be a position included in an edge area of the substrate W. Optionally, the second supply position may be an area adjacent to the edge area of the substrate W. Optionally, the process position of the nozzle 390 may be defined only as the first supply position.

The actuating module 381 may include an arm 382, a support shaft 386, and an actuator 388.

The support shaft 386 may be located at a side of the processing container 320. The support shaft 386 may have a rod shape with its longitudinal direction being the third direction 16. The support shaft 386 may be rotated by the actuator 388. In addition, the support shaft 386 may be moved upward and downward. In other words, the actuator 388 may include a rotation actuator that rotates the support shaft 386 and a lifting actuator that moves the support shaft 386 upward and downward.

The arm 382 may be coupled to an upper end of support shaft 386. The arm 382 may extend perpendicularly from the support shaft 386. The nozzle 390 may be fixedly coupled to an end of the arm 382.

As the support shaft 386 is rotated, the arm 382 may be rotated about the support shaft 386 and the nozzle 390 fixedly coupled to the end of the arm 382 may also be rotated. Thus, the rotation of the support shaft 386 may allow the nozzle 390 to be swung and moved in conjunction with the arm 382. The nozzle 390 may be swung and moved to the process position and the standby position.

In addition, as the support shaft 386 is moved upward and downward, the arm 382 and the nozzle 390 may also be moved upward and downward. Thus, the upward and downward movement of the support shaft 386 may allow the height of the nozzle 390 to be adjusted.

Optionally, the arm 382 may be moved forward and backward along its longitudinal direction. When viewed from above, a moving path of the nozzle 390 may coincide with the central axis of the substrate W at the process position.

Meanwhile, the processing liquid serving as the cleaning liquid may be, for example, one of a chemical, a rinse liquid, and an organic solvent. Alternatively, the processing liquid may be a mixture of two or more processing liquids. The chemical may be a liquid having acidic or basic properties. Examples of the chemical may include sulfuric acid ($H_2SO_4$), phosphoric acid ($P_2O_5$), hydrofluoric acid (HF), and ammonium hydroxide ($NH_4OH$). The rinse liquid may be pure water ($H_2O$). The organic solvent may be isopropyl alcohol (IPA). Meanwhile, unlike illustrated in FIG. 2, a plurality of first nozzles 392 may be provided for supplying different types of processing liquids. In this case, a plurality of first actuating modules may also be provided in the same number as the first nozzles 392.

In addition, the drying gas may be one of inert gases such as nitrogen.

Figure 4:
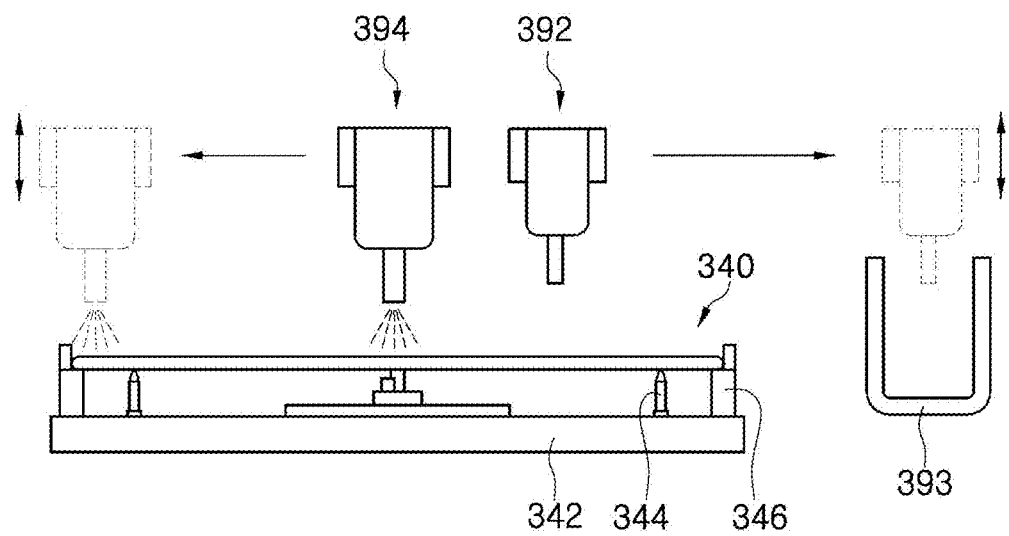
FIG. 4 is a view illustrating an operation example of the substrate processing apparatus illustrated in FIG. 2.

FIG. 4 is a view illustrating an operation example of the substrate processing apparatus 300 according to the embodiment of the present disclosure.

As described above, even when the first nozzle 392 and the second nozzle 394 have the same configuration and the first actuating module and the second actuating module have the same configuration, since the first actuating module and the second actuating module according to the present disclosure may be separately (individually) provided, the movement of the first nozzle 392 and the movement of the second nozzle 394 may be performed independently of each other. Thus, a drop risk possessed by the processing liquid may be eliminated and drying performance may be improved.

According to the configuration in which the first actuating module and the second actuating module are separately (individually) provided, the first nozzle 392 may be moved to the standby position immediately after completing a liquid ejection process. In other words, the first nozzle 392 may be moved to the standby position as soon as the liquid ejection process is completed, regardless of driving of the second nozzle 394. This may prevent an undesired IPA drop phenomenon that may occur when the first nozzle 392 waits on the substrate W without moving to the standby position during a drying process by the second nozzle 394. Furthermore, it is possible to prevent undesired defects on the substrate W, such as particles accumulating to one side and particles forming a ring pattern, caused by the IPA drop phenomenon acting as a particle source.

To perform the drying process immediately after the liquid ejection process of the first nozzle 392 is completed, the second nozzle 394 may be moved from a standby position to a process position while the liquid ejection process is performed by the first nozzle 392. This may prevent a delay between the liquid ejection process and the drying process, thereby improving substrate cleaning efficiency.

In addition, due to such independent movements of the first nozzle 392 and the second nozzle 394, a scanning range of the substrate W of the second nozzle 394 may be increased compared to the related art. This may lead to expanding a drying range by the second nozzle 394, especially expanding an edge drying range, thereby improving the problem of abnoamal wafer maps.

Here, the second nozzle 394 is preferably provided at a position closer to the center of the substrate W than the first nozzle 392. By disposing the second nozzle 394 closer to the center of the substrate W than the first nozzle 392, an area of the substrate W where the drying gas ejected from the second nozzle 394 reaches may be expanded. Due to the expanded area of the substrate W where the drying gas reaches, drying performance may be improved.

In the substrate processing apparatus 300 according to the embodiment of the present disclosure, the distance between the first nozzle 392 and the second nozzle 394 may be adjusted on the basis of the horizontal positions of the first nozzle 392 or the second nozzle 394. As an example, the distance between the first nozzle 392 and the second nozzle 394 may be controlled to be decreased as the first nozzle 392 is moved from above a central area to the edge area of the substrate W. As an example, controlling the distance between the first nozzle 392 and the second nozzle 394 may be achieved in such a manner that while the rotational speed of the first nozzle 392 is maintained constant, the rotational speed of the second nozzle 394 is decreased when the second nozzle 394 is positioned above the central area of the substrate W and the rotational speed of the second nozzle 394 is increased as the second nozzle 394 is moved to above the edge area of the substrate W from the point where a drying ring R illustrated in FIG. 3 is formed.

By positioning the first nozzle 392 and the second nozzle 394 spaced apart from each other when the first nozzle 392 is positioned above the central area of the substrate W, scattering of the processing liquid caused by the first nozzle 392 may prevented by the second nozzle 394. Also, by positioning the first nozzle 392 and the second nozzle 394 adjacent to each other as the first nozzle 392 is moved from above the central area of the substrate W to above the edge area of the substrate W, the processing liquid remaining on the substrate W may be entirely removed by the second nozzle 394 via centrifugal force. Thus, uniform drying of the entire area of the substrate W may be achieved, thereby improving drying performance.

Thus, the height of the second nozzle 394 may be controlled on the basis of the horizontal position of the second nozzle 394. Specifically, the height of the second nozzle 394 may be controlled to be increased as the second nozzle 394 is moved from above the central area of the substrate W to above the edge area of the substrate W. By increasing the height of the second nozzle 394 as the second nozzle 394 is positioned closer to the edge area than the central area of the substrate W, the flow rate of the drying gas supplied onto the substrate W may be increased, thereby increasing the drying gas concentration on the substrate W and preventing scattering of the processing liquid caused by the substrate support unit 340 rotated at high speed. As a result, a chemical liquid atmosphere around the substrate W may be rapidly replaced with a drying gas atmosphere, thereby achieving uniform drying of the entire substrate W more rapidly and efficiently and thus improving drying performance.

Meanwhile, the area of an outlet of the second nozzle 394 may be formed equal to or greater than that of an outlet of the first nozzle 392 so that the flow rate of the drying gas supplied onto the substrate W is increased. By increasing the flow rate of the drying gas supplied onto the substrate W, the drying gas concentration on the substrate W may be increased. Due to the increased drying gas concentration on the substrate W, it is possible to facilitate atmosphere replacement with the drying gas and increase the effect of preventing the processing liquid from scattering.

Figure 5:
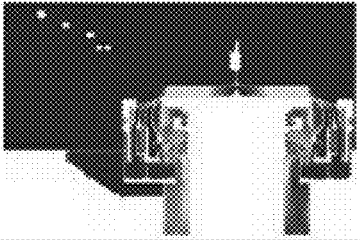
FIG. 5 is a view illustrating a comparison in drying performance between the related art and an embodiment of the present disclosure.
Figure 5:
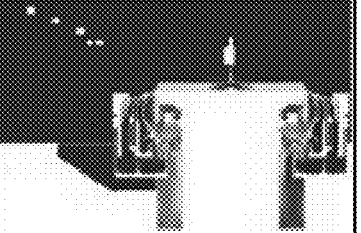
Figure 5:
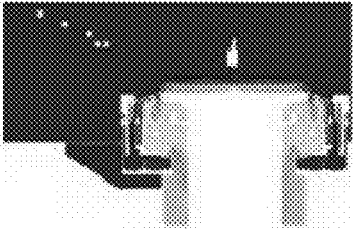
Figure 5:
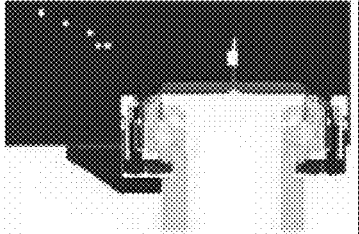

FIG. 5 is a view illustrating a simulation result for the drying performance improvement effect according to the embodiment of the present disclosure. As a comparative example, a conventional cleaning processing apparatus was used. Referring to FIG. 5, it can be seen that in the case of the embodiment of the present disclosure, the concentration of drying gas (inert gas) present around the substrate is significantly improved compared to the conventional cleaning processing apparatus. Due to the significantly improved concentration of drying gas present around the substrate, it can be expected that drying performance will be improved.

The controller 600 may control the actuating module 381. The controller 600 may be connected to the first actuating module and the second actuating module to individually control the movement of the first nozzle 392 by the first actuating module and the movement of the second nozzle 394 by the second actuating module. As an example, the controller 600 may include an actuating controller for controlling the actuating module 381, and the actuating controller may generate a control signal on the basis of a substrate processing step and transmit the control signal to the actuating module 381. The actuating controller may control the distance between the first nozzle 392 and the second nozzle 394 on the basis of the horizontal positions of the first nozzle 392 and the second nozzle 394 according to the substrate processing step. As an example, the actuating controller may control the distance between the first nozzle 392 and the second nozzle 394 by controlling the speeds of the first nozzle 392 and the second nozzle 394. Here, the distance between the first nozzle 392 and the second nozzle 394 includes a horizontal distance and a vertical distance between the first nozzle 392 and the second nozzle 394. The actuating controller may control the height of the second nozzle 394 on the basis of the horizontal position of the second nozzle 394 according to the substrate processing step.

In addition, the controller 600 may control the rotation actuating member. The controller 600 may be connected to the actuator 349 of the rotation actuating member to adjust the rotational speed of the support member 342. As an example, the controller 600 may generate a control signal on the basis of the substrate processing step and transmit the control signal to the actuator 349. The actuator 349 may adjust the rotational speed of the support member 342 on the basis of the control signal transmitted from the controller 600. Meanwhile, the control signal generated by the controller 600 is not limited thereto, and the controller 600 may generate any of various types of signals.

FIG. 6 is a flowchart schematically illustrating a substrate processing method according to an embodiment of the present disclosure.

A substrate processing method according to the present disclosure may include a method of cleaning a substrate by using a substrate cleaning apparatus. As an example, the substrate processing method according to the present disclosure may be performed by the above-described substrate processing apparatus.

Referring to FIG. 6, the substrate processing method according to the present disclosure may include a first nozzle moving step S10, a cleaning liquid supplying step S20, a second nozzle moving step S30, and a drying gas supplying step S40.

The first nozzle moving step S10 is a step of moving a first nozzle 392 supplying a cleaning liquid onto a substrate W, and may include a step of moving the first nozzle 392 from a standby position to a process position and a first nozzle returning step S50 of returning the first nozzle 392 from the process position to the standby position. Here, the standby position of the first nozzle 392 may be defined as a position where the first nozzle 392 is placed at a position that does not correspond to a substrate support unit 340. In the standby position, the first nozzle 392 may be located above a first nozzle groove 393. The process position may be a position where the first nozzle 392 is placed at a position corresponding to the substrate support unit 340, and the process position that the first nozzle 392 finally reaches after moving from the standby position may be a position corresponding to the central area of the substrate W. The first nozzle moving step S10 may be performed at a constant speed.

In the first nozzle moving step S10, the first nozzle 392 may be swung and moved to the standby position and the process position as a first support shaft is rotated. Optionally, the first nozzle moving step S10 may further include a step of moving the first nozzle 392 upward.

The cleaning liquid supplying step S20 is a step of supplying the cleaning liquid onto the substrate W by the first nozzle 392 moved to the process position. In the cleaning liquid supplying step S20, the cleaning liquid may be supplied onto the substrate W rotated by the substrate support unit 340. As an example, an ejection point of the first nozzle 392 may be changed between the central area of the substrate W and the edge area of the substrate W. As an example, the point where the cleaning liquid ejected from the first nozzle 392 is deposited when the cleaning liquid supplying step S20 starts may be the central area of the substrate W, and the point where the cleaning liquid ejected from the first nozzle 392 is deposited when the cleaning liquid supplying step S20 ends may be the edge area of the substrate W.

The second nozzle moving step 310 is a step of moving a second nozzle 394 supplying a drying gas onto the substrate W, and may include a step of moving the second nozzle 394 from a standby position to a process position and a second nozzle returning step S60 of returning the second nozzle 394 from the process position to the standby position. Here, the standby position of the second nozzle 394 may be a position where the second nozzle 394 is placed at a position that does not correspond to the substrate support unit 340. The process position may be a position where the second nozzle 394 is placed at a position corresponding to the substrate support unit 340, and the process position that the second nozzle 394 finally reaches after moving from the standby position may be a position corresponding to the central area of the substrate W. Alternatively, the process position that the second nozzle 394 finally reaches after moving from the standby position may be an edge portion of the substrate W that the substrate W can reach as it is rotated as much as possible from the standby position toward the process position. In other words, the edge portion may be an edge area existing on the opposite side of the edge area of the substrate W adjacent to the standby position of the second nozzle 394.

In the second nozzle moving step S30, the second nozzle 394 may be swung and moved to the standby position and the process position as a second support shaft is rotated. For efficiency of the substrate processing method, the second nozzle moving step S30 may start while the cleaning liquid supplying step S20 is performed. As an example, to perform a drying process immediately after a liquid ejection process of the first nozzle 392 is completed, the second nozzle 394 may be moved from the standby position to the process position while the liquid ejection process is performed by the first nozzle 392. This may prevent a delay between the liquid ejection process and the drying process, thereby improving substrate cleaning efficiency.

The second nozzle moving step S30 may further include a step of moving the second nozzle 394 upward. The lifting of the second nozzle 394 may be performed on the basis of the horizontal position of the second nozzle 394. The height of the second nozzle 394 may be controlled to be increased as the second nozzle 394 approaches the edge area from the center area of the substrate W. By positioning the second nozzle 394 at a higher position in the edge area of the substrate W than in the central area thereof, the flow rate of the drying gas supplied onto the substrate W may be increased to thereby increase the drying gas concentration on the substrate W. This may facilitate atmosphere replacement and prevent scattering of the processing liquid caused by the substrate support unit 340 rotated at high speed. In other words, the atmosphere around the substrate W may be easily replaced with a drying gas atmosphere, and the processing liquid from the substrate W may be prevented from scattering to the outside of the processing space.

The drying gas supplying step S40 is a step of supplying the drying gas onto the substrate W by the second nozzle 394 moved to the process position. In the drying gas supplying step S40, an inert gas such as nitrogen may be supplied onto the substrate W rotated by the substrate support unit 340. As an example, an ejection point of the second nozzle 394 may be changed between the central area of the substrate W and the edge area of the substrate W. As an example, the point where the drying gas ejected from the second nozzle 394 is deposited when the drying gas supplying step S40 starts may be the edge area of the substrate W adjacent to the standby position of the second nozzle 394, and the point where the drying gas ejected from the second nozzle 394 is deposited when the drying gas supplying step S40 ends may be the edge area of the substrate W on the opposite side of the above edge area.

The first nozzle returning step S50 is a step of returning the first nozzle 392, which has finished discharging the cleaning liquid, from the process position to the standby position. The first nozzle returning step S50 may be performed immediately after the cleaning liquid supplying step S20 is completed. The first nozzle returning step S50 may be performed independently of the second nozzle moving step S30. By performing the first nozzle returning step S50 independently of the second nozzle moving step S30 and performing the first nozzle returning step S50 immediately after completing the cleaning liquid supplying step S20, an undesired IPA drop phenomenon, which may occur when the first nozzle 392 waits on the substrate W without moving to the standby position during the drying process by the second nozzle 394, may be prevented. Also, undesired defects on the substrate W, such as particles accumulating to one side and particles forming a ring pattern, caused by the IPA drop phenomenon may be prevented.

Meanwhile, the substrate processing method according to the present disclosure may further include a nozzle distance controlling step of controlling the distance between the first nozzle 392 and the second nozzle 394 on the basis of the horizontal position of at least one of the first nozzle 392 and the second nozzle 394.

In the nozzle distance controlling step, the distance between the first nozzle 392 and the second nozzle 394 may be controlled to be decreased as the first nozzle 392 is moved from the process position to the standby position, that is, as the first nozzle 392 is moved from above the central area of the substrate W to above the edge area of the substrate W. As an example, the nozzle distance controlling step may be performed by adjusting the speeds of the first nozzle 392 and the second nozzle 394. The distance between the first nozzle 392 and the second nozzle 394 may be controlled in such a manner that while the rotational speed of the first nozzle 392 is maintained constant, the rotational speed of the second nozzle 394 is decreased or increased according to the horizontal position of the second nozzle 394.

Specifically, controlling the distance between the first nozzle 392 and the second nozzle 394 may be achieved in such a manner that while the rotational speed of the first nozzle 392 is maintained constant, the rotational speed of the second nozzle 394 is decreased when the second nozzle 394 is positioned above the central area of the substrate W and the rotational speed of the second nozzle 394 is increased as the second nozzle 394 is moved to above the edge area of the substrate W from the point where the drying ring R illustrated in FIG. 3 is formed.

By positioning the first nozzle 392 and the second nozzle 394 spaced apart from each other when the first nozzle 392 is positioned above the central area of the substrate W, scattering of the processing liquid caused by the first nozzle 392 may prevented by the second nozzle 394. Also, by positioning the first nozzle 392 and the second nozzle 394 adjacent to each other as the first nozzle 392 is moved from above the central area of the substrate W to above the edge area of the substrate W, the processing liquid remaining on the substrate W may be entirely removed by the second nozzle 394 via centrifugal force. Thus, uniform drying of the entire area of the substrate W may be achieved, thereby improving drying performance.

Although exemplary embodiments of the present disclosure have been described for illustrative purposes, those skilled in the art will appreciate that various modifications, additions, and substitutions are possible, without departing from the scope and spirit of the present disclosure. Therefore, exemplary embodiments of the present disclosure have not been described for limiting purposes, and the scope of the disclosure is not to be limited by the above embodiments. The scope of the present disclosure should be determined on the basis of the descriptions in the appended claims, and all equivalents thereof should belong to the scope of the present disclosure.

What is claimed is:

1. A substrate processing method for processing a substrate by using a liquid processing apparatus, the substrate processing method comprising:
   a first nozzle moving step of moving a first nozzle to a process position and a standby position in a swing motion manner;
   a cleaning liquid supplying step of supplying, by the first nozzle, a cleaning liquid onto a rotating substrate at the process position of the first nozzle;
   a second nozzle moving step of moving a second nozzle to a process position and a standby position in a swing motion manner;
   a drying gas supplying step of supplying, by the second nozzle, a drying gas onto the rotating substrate at the process position of the second nozzle; and
   a nozzle distance controlling step of controlling a distance between the first nozzle and the second nozzle on the basis of a horizontal position of at least one of the first nozzle and the second nozzle.

2. The substrate processing method of claim 1, wherein the first nozzle moving step comprises:
   a step of moving the first nozzle from the standby position to the process position; and
   a step of moving the first nozzle from the process position to the standby position, and
   the step of moving the first nozzle from the process position to the standby position is performed immediately after the cleaning liquid supplying step is completed.

3. The substrate processing method of claim 2, wherein the nozzle distance controlling step is performed by controlling the distance between the first nozzle and the second nozzle to be decreased as the first nozzle is moved from above a central area of the substrate to above an edge area of the substrate.

4. The substrate processing method of claim 1, wherein the second nozzle moving step comprises:
   a step of moving the second nozzle from the standby position to the process position; and
   a step of moving the second nozzle from the process position to the standby position, and
   the step of moving the second nozzle from the process position to the standby position is performed while the cleaning liquid supplying step is performed.

5. The substrate processing method of claim 4, wherein the second nozzle moving step further comprises a step of moving the second nozzle upward as the second nozzle is moved from above a central area of the substrate to above an edge area of the substrate.

6. The substrate processing method of claim 1, wherein a horizontal moving speed of the first nozzle is maintained constant in the first nozzle moving step, and a horizontal moving speed of the second nozzle is decreased or increased according to the horizontal position of the second nozzle.

* * * * *